United States Patent
Kaule et al.

(10) Patent No.: US 6,284,396 B1
(45) Date of Patent: Sep. 4, 2001

(54) TRANSFER BAND

(75) Inventors: Wittich Kaule, Emmering; Gregor Grauvogl, Munich, both of (DE)

(73) Assignee: Giesecke and Devrient GmbH (DE)

( * ) Notice: Subject to any disclaimer, the term of this patent is extended or adjusted under 35 U.S.C. 154(b) by 0 days.

(21) Appl. No.: 08/809,725
(22) PCT Filed: Aug. 7, 1996
(86) PCT No.: PCT/EP96/03500
§ 371 Date: Jun. 10, 1997
§ 102(e) Date: Jun. 10, 1997
(87) PCT Pub. No.: WO97/06017
PCT Pub. Date: Feb. 20, 1997

(30) Foreign Application Priority Data

Aug. 8, 1995 (DE) ................................ 195 29 171

(51) Int. Cl.$^7$ ................... B32B 7/00; B41M 13/12
(52) U.S. Cl. ............... 428/702; 428/142; 428/213; 428/446; 428/448; 428/451; 428/915; 283/72; 283/74; 283/81; 283/100; 427/248.1
(58) Field of Search ...................... 428/172, 426, 428/449, 692, 702, 914, 915, 916, 450, 446, 448, 451; 283/72, 74, 81, 86, 91; 427/84, 103, 248.1

(56) References Cited

U.S. PATENT DOCUMENTS

| | | | |
|---|---|---|---|
| 4,455,181 | * 6/1984 | Lifshin et al. | 156/150 |
| 4,631,223 | * 12/1986 | Sander | 428/172 |
| 4,923,749 | * 5/1990 | Talvalkar | 428/341 |
| 5,158,707 | * 10/1992 | Vestberg et al. | 252/500 |
| 5,251,937 | * 10/1993 | Ojster | 283/91 |
| 5,256,506 | * 10/1993 | Ellis et al. | 430/20 |
| 5,322,975 | * 6/1994 | Nagy et al. | 174/257 |
| 5,354,099 | * 10/1994 | Kaule et al. | 283/85 |
| 5,383,687 | * 1/1995 | Suess et al. | 283/86 |
| 5,458,713 | * 10/1995 | Ojster | 156/234 |
| 5,714,231 | * 2/1998 | Reinhart et al. | 428/156 |
| 5,781,316 | * 7/1998 | Strahl et al. | 359/3 |
| 5,817,205 | * 10/1998 | Kaule | 156/233 |
| 5,820,971 | * 10/1998 | Kaule et al. | 428/209 |
| 5,882,463 | * 3/1999 | Tompkin et al. | 156/234 |

FOREIGN PATENT DOCUMENTS 92 17 061 * 5/1993 (DE).
WO 94/25288 * 11/1994 (WO).

* cited by examiner

Primary Examiner—Deborah Jones
Assistant Examiner—Stephen Stein
(74) Attorney, Agent, or Firm—Bacon & Thomas, PLLC

(57) ABSTRACT

The invention relates to a multilayer foil, in particular a transfer foil. The transfer foil consists of a carrier. foil, a one- or multilayer transfer layer containing an optically variable structure, and an intermediate layer located between the carrier foil and the transfer layer, the intermediate layer being a metal oxide or semiconductor oxide layer.

15 Claims, 1 Drawing Sheet

TRANSFER BAND

This invention relates to a multilayer material, in particular a transfer band, consisting of a carrier material and a one- or multilayer transfer layer containing an optically varying structure, and an intermediate layer located between the carrier band and the transfer layer, and to a method for producing this material.

With bank notes, identity cards, passports or similar documents it is necessary to take measures to increase security. Protection from imitation can be clearly increased if these documents are equipped with transfer elements having a hologram, diffraction grid or other effect varying with the viewing angle. For this purpose it is already known to apply holograms by the transfer method to cards, bank notes or other documents which must meet a high security standard.

The optically varying element, for example hologram, is usually transferred from a transfer band using pressure and heat. The transfer bands for transferring holograms consist of a carrier foil, a heat-activable release layer, a thermoplastic lacquer layer with holographic embossing, an aluminized layer, a protective layer and a hot-melt adhesive layer. When the transfer hologram is transferred to the substrate the thermoplastic lacquer layer including the following layers is transferred to the substrate with the help of the hot-melt adhesive layer, while the carrier foil along with the thermally activable release layer are removed during the transfer process.

For many applications it has proved useful to use instead of the thermoplastic lacquer layer a lacquer which cures with the help of radiation. These lacquers have the advantage that they are not thermally deformable upon transfer to a substrate. So-called delayed-curing lacquers are often used whose curing is initiated e.g. by UV radiation. However, curing occurs only after a certain delay time. This permits the lacquer to be irradiated directly before embossing, to retain the necessary plasticity during then embossing process and to cure irreversibly directly after embossing independently without further method steps. since the irradiation and resulting high action of heat can also activate the release layer with this mode of operation, however, there is the great danger of the carrier layer coming off the transfer layer prematurely when the diffraction structure is being embossed in the lacquer layer. One therefore usually dispenses with a release layer completely in this procedure. But release layers have the function of facilitating detachment of, the transfer element from the carrier when the transfer element is transferred to a substrate. If a release layer is dispensed with, the property then lacking in the transfer band must be obtained in a different way. For example one can integrate the properties the release layer into the embossing lacquer layer.

EP 0 502 111 B1 describes :or this purpose a lacquer whose properties are modified in such a way that it is readily possible to emboss the lacquer layer without the lacquer coming off the carrier, while the lacquer is simultaneously easy to detach from the transfer foil when the element is transferred to a substrate.

Since the adhesion of the lacquer layer to the carrier foil depends essentially on the nature and pretreatment of the foil, the lacquer layer is adapted by additives to the particular plastic film used as a carrier layer.

This means that the embossing lacquer layer and the carrier layer must be coordinated to each other in such a way a: to fulfill the described conditions difficult to reconcile with each other.

Furthermore the adhesion coefficients of the lacquer layer on the carrier are often not constant even when the same carrier materials are used. The properties of the carrier foil are subject to accidental fluctuations, which may be caused e.g. by fluctuations in the conditions of production, the storage period, aging or the like. This leads to different adhesion coefficients of the carrier foil surface so that it is necessary to adapt the adhesion of the embossing lacquer layer to the carrier used, even when the same plastic carrier foil is used.

The problem of the invention is therefore to propose a transfer and with a carrier band and a transfer layer, and a method for producing it, whereby the carrier band has a defined adhesion to the transfer layer.

This problem is solved by the features of the independent claims. Special embodiments are the object of the subclaims.

The basic idea of the invention is to provide a defined adhesion of the carrier band to the transfer layer by pretreating the carrier band. For this purpose the carrier band is provided with a thin metal or semiconductor oxide layer to which the transfer layer is then applied.

A special advantage of the inventive solution is the fact that application of the thin oxide layer decouples the adhesion of the carrier layer to the transfer layer from the surface properties of the carrier layer. Thus the transfer layer can be selected almost independently of the carrier band properties, without the desired adhesion coefficients being adversely affected. This is of course also the case with plastic carrier bands which are made of the same plastic material but come from different production batches. Application of a metal or semiconductor oxide layer to the carrier band creates particular defined adhesion conditions with the transfer layer located thereabove. The particular adhesion coefficient achieved is thus determined only by the adhesion of the transfer layer to the oxide layer, being between 15 and 80 mN/m, preferably between 30 and 38 mN/m.

Although many materials can be used for the carrier and, such as plastic, paper or silicone paper, in a preferred embodiment a carrier foil, for example a polyethylene terephthalate foil, is vaporized with a silicon oxide layer ($SiO_x$). Since a mixture of $SiO$ and $SiO_2$ is deposited on the carrier foil in this process, $SiO_x$ layer with $1<x<2$ arises on the carrier foil. The thickness of the layer is selected is as to obtain a continuous area coating of the carrier foil, on the one hand, while the vaporized layer remains transparent, an the other hand. The silicon oxide layer is then coated with an embossing lacquer in which the desired hologram is provided e.g. with the help of an embossing roll in a further operation. After the embossing lacquer cures or crosslinks, the side bearing the hologram structure is provided with a metal layer. A mixed adhesive can optionally be applied to the metal layer.

The silicon oxide layer adjusts the adhesion coefficient of the transfer hologram to the carrier material just so that the hologram can be provided in the embossing lacquer layer without the transfer layer coming off the carrier. The hologram can accordingly be easily transferred to a substrate for example with a punch or pressing roll and easily detached from the carrier foil.

BRIEF DESCRIPTION OF THE DRAWINGS

Further advantages and process variants will be explained with reference to the following figures. It is pointed out that the figures offer no true-to-scale representations of the Invention but are only intended for pictorialization.

As shown in FIG. 1, one can use the inventive transfer fail to apply transfer element 15 a data carrier, in the present case bank note 16. Optically variable element 15 is executed in particular as a hologram and can he applied to the data carrier so as to extend from one lateral edge to the opposite lateral edge of the data carrier. Otherwise one can also employ so-called island solution, applying optically variable element 15 at any place on the data carrier as a separate element. There are no restrictions on the form and size of the optically variable element so that the element can be adapted without difficulty to the particular desired design of date carrier.

FIG. 2 shows schematically she basic principle of the inventive foil pretreatment for producing a transfer foil. Carrier foil 3 is wound on roll 2 and guided via vaporization unit 4 to second roll 1 on which the foil is rolled up again after application of the metal or semiconductor oxide layer. As a carrier foil one can use for example polyethylene terephthalate (PET), oriented polypropylene (OPP), oriented polyamide (OPA) or another sufficiently stable foil. In vaporization unit 4 the metal or semiconductor oxide to be applied, for example silicon monoxide, is heated and evaporated in a heatable pan. The SiO to be evaporated exists in the pan as brown powder. The particles passing into the vapor phase are deposited on the surface of the carrier fail, forming a thin film whose thickness depends an the transport speed of the carrier foil and the evaporation temperature. Although evaporation takes place in a vacuum, no pure silicon monoxide layer is deposited on the foil web. This is because oxygen from the existing residual air reacts with SiO to $SiO_2$, so that a layer of a mixture of SiO ant SiO2, the so-called $SiO_x$ layer, is deposited on the surface of the foil web. Oxygen bound to the surface of the foil also makes a contribution to forming $SiO_2$. Depending an the exide layer to be applied, the process parameters are selected so that layers are applied in a thickness of no more than 200 nm, preferably in a thickness of 60 to 100 nm. These thin layers have the advantage that they already form a sufficiently defined adhesion surface for the lacquer Layer to be applied later, on the one hand, and are transparent, on the other hand. They therefore do not influence the optical impression or be obtained by the transfer element. Unlike the evaporation temperatures of aluminum, those of silicon oxide are relatively high, i.e. generally between 1350 and 1400° C., so that it is necessary to, cool rolls 1 and 2 during vaporizing of the oxide.

Figure 1:
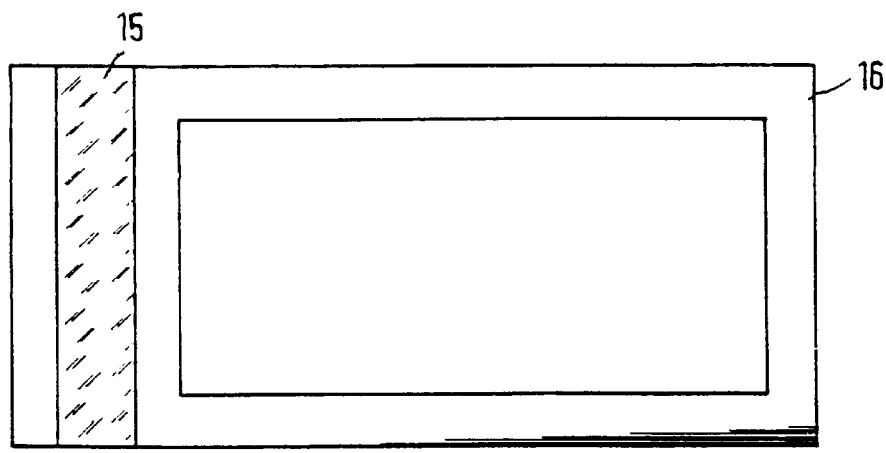
FIG. 1 shows a document, Quipped with an inventive security element.

The deposition rate of the oxide layer can be controlled for example by providing windows 6 and 7 in the evaporation unit. Through window 6 light ray 8 with intensity $I_0$ from light source 5 is guided into the interior of evaporation unit 4. Depending an the quantity of particles rising due to evaporation, the incident light ray is scattered more or less diffusely so that intensity $I_0$ is lowered by a certain amount. Intensity $I_1$ emerging from window 7, or quotient $I_1/I_0$ is a direct measure of the evaporation rate, which can then be regulated according to the particular requirements.

Figure 2:
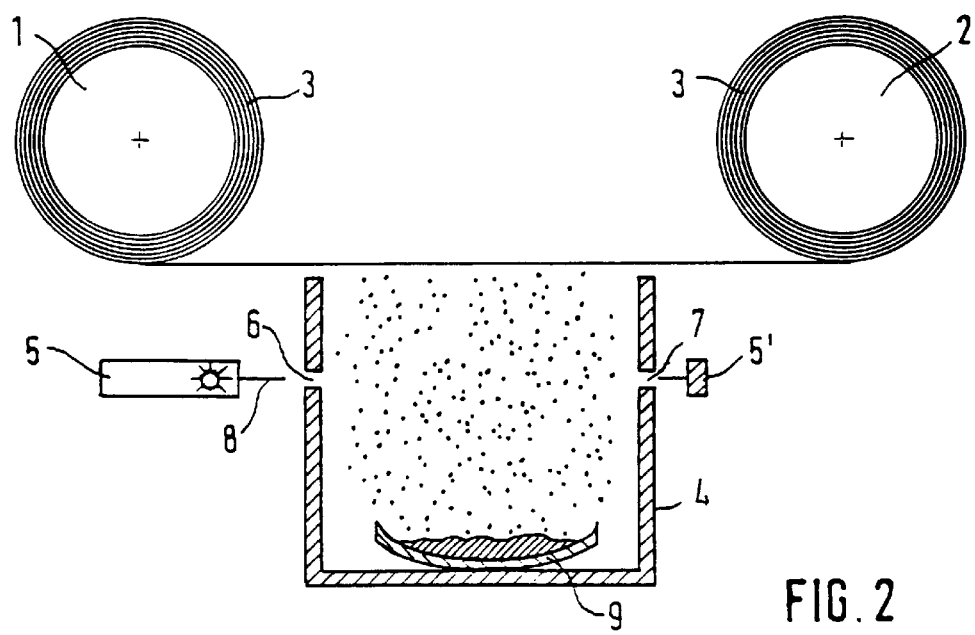
FIG. 2 shows the basic principle of the inventive foil pretreatment.

Instead of using evaporation unit 4 shown in FIG. 2 one can also deposit the metal or semiconductor oxide layer on the carrier material from the vapor phase by other process techniques such as chemical precipitation. Evaporation unit 4 can also be executed as an electron-beam coating unit in which an electron beam is used as a heating source. The basically point-shaped electron beam is guided quickly across evaporation pan 9 containing the oxide material to be evaporated. Electron-beam coating has the advantage that this technique permits coating of broad webs and the path speed can be increased.

After the carrier foil is coated with the thin $SiO_x$ layer the one- or multilayer transfer layer is applied to this $SiO_x$ layer in a further operation. During production of hologram transfer layers an embossing lacquer layer is applied for this purpose to the $SiO_x$ layer, in which the particular desired holographic embossed structure is impressed. After that embossing lacquer layer cures of crosslinks, a metal layer is applied thereto in a further operation for clearly strengthening the optical impression of the embossed hologram. If necessary, the metal layer is provided with a hot-melt adhesive layer with which the transfer element can be glued directly to a substrate. One can dispense with this adhesive layer, however, if a suitable adhesive layer is applied to the substrate directly before application of the transfer element and the transfer element is transferred to the areas of the substrate coated with adhesive. In such cases it is favorable to use adhesives with delayed curing, i.e. whose curing is initiated for example by a UV lamp after application.

Figure 3:
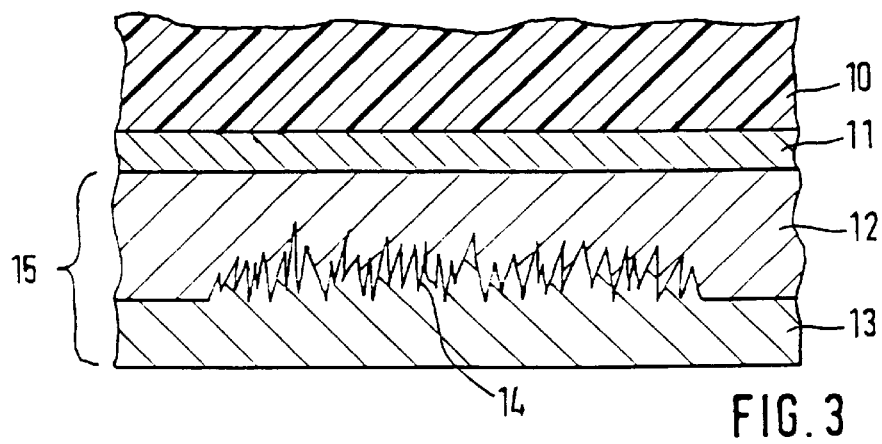
FIG. 3 shows the structure of an inventive transfer foil.

The structure of the inventive transfer band is shown schematically in FIG. 3. Thin semiconductor or metal oxide layer 11, for example a $SiO_x$, magnesium oxide or aluminum oxide layer, is applied to carrier foil 10. This oxide layer bears transfer layer 15 to be transferred to the substrate, said transfer layer being executed in the present case as a multilayer layer. Transfer layer 15 consists of lacquer layer 12 in which holographic structure 14 is embossed. On the embossed site of the lacquer layer a metal layer is applied, preferably being vaporized. Depending on how the transfer layer is to be applied to the substrate, a further hot-melt adhesive layer not shown in FIG. 3 is applied to metal layer 13.

The adhesive band between the carrier foil and the transfer layer is adjusted via oxide layer 11 in very exact and defined fashion. For a silicon oxide layer which is vaporized on an OPA foil, the adhesion coefficients an a UV lacquer layer printed an the oxide layer can be adjusted in the range between 15 to 50 mN/m, preferably from 30 mN/m to 38 mN/m.

However the invention is not restricted to providing a certain transfer layer, for example a hologram The inventive transfer hand can instead he used or transfer almost any layers to substrates. Along with the abovementioned holograms, one can also transfer smooth metallic surfaces, magnetic layers or surfaces with effect pigments to substrates such as paper, plastic or metal. From the point of view of security it is especially interesting to use layers with optically recognizable or optically variable properties and with machine-readable properties.

The inventive transfer foil will be explained further by examples.

EXAMPLE 1

A 25 micron OPA foil is vaporized with silicon oxide (0.1 g/m² to 0.25 g/m²). or A UV-crosslinkable lacquer is then applied to the silicon oxide layer by one of the common techniques, for example printing. After holographic embossing and UV curing, the foil is vaporized with aluminum. After application of this transfer foil with a mixed adhesive the OPA carrier foil can be removed very easily without defects arising on the remaining hologram embossed layer.

EXAMPLE 2

A 25 micron OPA foil is vaporized with silicon oxide and coated with a thermoplastic lacquer. After holographic embossing with a heated embossing roll the foil is vaporized with A mixed adhesive is applied to the aluminum foil. Upon transfer of the transfer layer the CPA carrier foil can removed very easily without leaving any defects on the transfer layer.

EXAMPLE 3

A 25 micron CPA foil is vaporized with silicon oxide and coated with a cold-crosslinking lacquer. After the lacquer cures, the foil is vaporized with copper. With the help of a mixed which is applied directly to the substrate, the transfer element of the transfer foil is transferred to the substrate, whereby the CPA carrier foil Can be removed very easily. This produces a golden layer on the substrate.

EXAMPLE 4

A 12 micron PET foil is vaporized with silicon oxide and coated with a solvent-containing lacquer. After the lacquer dries, the foil is vaporized with aluminum. The application of the transfer element takes place as in Example 3 by applying a mixed adhesive directly to the substrate surface, then placing the transfer foil thereon and removing the carrier foil. This produces a silvery layer on the substrate.

What is claimed is:

1. A foil multilayer transfer material including a carrier band, a reaction lacquer layer which is provided with a holographic embossing and at least one plastic layer and an intermediate layer located between the carrier band and the plastic layer, wherein the intermediate layer comprises a metal oxide or semiconductor oxide layer.

2. The multilayer transfer material of claim 1, wherein the transfer material is a transfer foil.

3. The multilayer transfer material of claim 1, wherein the intermediate layer has a thickness of less than 200 nm.

4. The multilayer transfer material of claim 3, wherein the metal oxide or semiconductor oxide layer comprises a mixture of silicon oxide and silicon dioxide.

5. The multilayer transfer material of claim 1, wherein the intermediate layer is transparent.

6. The multilayer transfer material of claim 1, wherein the adhesion coefficient of the carrier band on the plastic layer is 15 to 50 mN/m.

7. The multilayer transfer material of claim 1, foil wherein the intermediate layer is thermally vapor deposited, chemically precipitated or electron beam vapor deposited.

8. The multilayer transfer material of claim 1, wherein the intermediate layer is an aluminum oxide or magnesium oxide layer.

9. The multilayer transfer material of claim 1, wherein the transfer material has a metallic surface, magnetic elements or effect pigments.

10. The multilayer transfer material of claim 3, wherein the intermediate layer has a thickness between 60 nm and 100 nm.

11. The multilayer transfer material of claim 4, wherein the intermediate layer has a thickness between 60 nm and 100 nm.

12. A method for producing a multilayer transfer material having a carrier band, a reaction lacquer layer which is provided with a holographic embossing, at least one plastic layer and an intermediate layer located between the carrier band and the plastic layer, comprising applying a metal or semiconductor oxide layer to one surface of the carrier band as an intermediate layer and covering this intermediate layer by application of the plastic layer, and providing a reaction lacquer layer with a holographic embossing.

13. The method of claim 12, including applying the intermediate layer as a thermally vaporized or chemically precipitated or vaporized layer, using electron beams on the surface of the carrier band.

14. The method of claim 12, including producing the intermediate layer by vaporizing a silicon oxide, magnesium oxide or aluminum oxide layer on the carrier foil.

15. The method of claim 12, including applying the metal or semiconductor oxide layer in a thickness of no more than 200 nm.

* * * * *